(12) United States Patent
Park et al.

(10) Patent No.: US 9,281,019 B2
(45) Date of Patent: Mar. 8, 2016

(54) THREE-DIMENSIONAL SEMICONDUCTOR DEVICES

(71) Applicants: Jintaek Park, Gyeonggi-do (KR); Youngwoo Park, Seoul (KR)

(72) Inventors: Jintaek Park, Gyeonggi-do (KR); Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 99 days.

(21) Appl. No.: 14/057,669

(22) Filed: Oct. 18, 2013

(65) Prior Publication Data

US 2014/0160828 A1 Jun. 12, 2014

(30) Foreign Application Priority Data

Dec. 10, 2012 (KR) ........................ 10-2012-0142895

(51) Int. Cl.
| | |
|---|---|
| *G11C 5/06* | (2006.01) |
| *G11C 5/02* | (2006.01) |
| *H01L 45/00* | (2006.01) |
| *H01L 27/24* | (2006.01) |

(52) U.S. Cl.
CPC ........... *G11C 5/063* (2013.01); *G11C 5/02* (2013.01); *H01L 27/249* (2013.01); *H01L 45/10* (2013.01); *H01L 45/1226* (2013.01); *H01L 45/146* (2013.01); *H01L 45/148* (2013.01)

(58) Field of Classification Search
CPC .......... G11C 5/063; G11C 5/02; H01L 45/10; H01L 45/1226; H01L 45/146; H01L 45/148; H01L 27/249

USPC ............ 365/63, 72, 185.17, 185.18; 257/314, 257/324, 326, E29.309, E21.645
See application file for complete search history.

(56) References Cited

U.S. PATENT DOCUMENTS

| | | | |
|---|---|---|---|
| 8,164,956 B2 | 4/2012 | Maeda | |
| 8,174,890 B2 | 5/2012 | Maeda et al. | |
| 8,217,446 B2 | 7/2012 | Fukuzumi et al. | |
| 8,247,863 B2 | 8/2012 | Fukuzumi et al. | |
| 8,349,689 B2 | 1/2013 | Lee et al. | |
| 8,372,720 B2 | 2/2013 | Fukuzumi et al. | |
| 8,415,242 B2 | 4/2013 | Mizushima et al. | |
| 8,743,612 B2 * | 6/2014 | Choi et al. ............... | 365/185.11 |
| 2010/0244119 A1 | 9/2010 | Fukuzumi et al. | |
| 2011/0062510 A1 | 3/2011 | Joo | |
| 2012/0043599 A1 | 2/2012 | Katsumata et al. | |

FOREIGN PATENT DOCUMENTS

KR 1020110028934 3/2011

* cited by examiner

*Primary Examiner* — Toan Le
(74) *Attorney, Agent, or Firm* — Myers Bigel & Sibley, PA

(57) ABSTRACT

A three-dimensional semiconductor device includes bit lines provided on a substrate, a gate structure provided between the substrate and the bit lines, a common source line provided between the gate structure and the bit lines, and channel pipes connecting the bit lines to the common source line. Each of the channel pipes may include a pair of vertical portions extending through the gate structure and a horizontal portion connecting the vertical portions. The pair of vertical portions are provided under a pair of the bit lines arranged adjacent to each other, respectively.

19 Claims, 15 Drawing Sheets

THREE-DIMENSIONAL SEMICONDUCTOR DEVICES

CROSS-REFERENCE TO RELATED APPLICATIONS

This U.S. non-provisional patent application claims priority under 35 U.S.C. §119 to Korean Patent Application No. 10-2012-0142895, filed on Dec. 10, 2012, in the Korean Intellectual Property Office, the disclosure of which is hereby incorporated by reference herein in its entirety.

BACKGROUND OF THE INVENTION

Example embodiments of the inventive concept relate to three-dimensional semiconductor devices.

In semiconductor devices, increased integration may be an important factor in realizing high performance, low cost devices. In a two-dimensional memory semiconductor device or in a planar memory semiconductor device, integration can be affected by techniques for forming fine patterns, as integration may be determined by the area occupied by a unit memory cell. However, since the equipment that may be used to form fine patterns is relatively expensive, there may be limitations as to economically increasing the integration of a two-dimensional memory semiconductor device. To address such a limitation, three-dimensional memory devices (that is, including three-dimensionally arranged memory cells) have been developed.

SUMMARY

Example embodiments of the inventive concept provide a three-dimensional semiconductor device with an increased page depth.

Other example embodiments of the inventive concept provide a three-dimensional semiconductor device that can be fabricated by a simplified fabrication process.

According to some example embodiments of the inventive concepts, a three-dimensional memory device includes a plurality of bit lines extending in a first direction and a common source line extending in a second direction on a substrate, and a plurality of channel pipes on the substrate connecting the common source line to ones of the bit lines. The channel pipes respectively include a pair of columnar portions protruding from the substrate and a coupling portion extending therebetween. Along the first direction, adjacent ones of the channel pipes are connected to different ones of the bit lines.

In some example embodiments, along the second direction, the number of bit lines may equal or outnumber the number of channel pipes.

In some example embodiments, along the second direction, adjacent ones of the channel pipes may be connected to alternating ones of the bit lines, respectively.

In some example embodiments, along the second direction, respective ones of the pair of columnar portions of each of the adjacent ones of the channel pipes may be connected to the alternating ones of the bit lines, respectively.

In some example embodiments, along the second direction, respective other ones of the pair of columnar portions of each of the adjacent ones of the channel pipes may be connected to the common source line.

In some example embodiments, along the second direction, the respective other ones of the pair of columnar portions of each of the adjacent ones of the channel pipes may overlap with ones of the bit lines between the alternating ones thereof, respectively, in plan view.

In some example embodiments, the coupling portion of the respective channel pipes may extend in a third direction that defines a non-parallel angle relative to the first direction of the bit lines.

In some example embodiments, the coupling portion of each of the channel pipes may overlap with two of the bit lines in plan view.

In some example embodiments, the third direction may define a non-perpendicular angle relative to the second direction of the common source line.

In some example embodiments, a gate structure may be provided between the bit lines and the substrate. The gate structure may include a plurality of word lines adjacent sidewalls of the columnar portions of the channel pipes and extending in the second direction, a string selection line extending in the second direction between the plurality of word lines and the bit lines, and a ground selection line extending in the second direction between the plurality of word lines and the common source line.

In some example embodiments, the string selection line and/or the ground selection line may have a same width as the word lines along the first direction.

In some example embodiments, the string selection line and/or the ground selection line may have a narrower width than the word lines along the first direction.

According to further example embodiments of the inventive concepts, a three-dimensional semiconductor device may include bit lines provided on a substrate, a gate structure provided between the substrate and the bit lines, a common source line provided between the gate structure and the bit lines, and channel pipes connecting the bit lines to the common source line. Each of the channel pipes may include a pair of vertical portions penetrating the gate structure and a horizontal portion provided below the gate structure to connect the vertical portions, and the pair of vertical portions may be provided under a pair of the bit lines arranged adjacent to each other, respectively.

In example embodiments, in each of the channel pipes, one of the pair of vertical portions may be connected to one of the bit lines, and the other may be connected to the common source line.

In example embodiments, the horizontal portion may be provided to have a longitudinal direction that may be at an angle to the bit line.

In example embodiments, an angle between the horizontal portion and the bit line ranges from 3 degree to 45 degree.

In example embodiments, the device may further include at least one string selection line interposed between the gate structure and the bit lines, and a ground selection line interposed between the gate structure and the common source line. The at least one string selection line may be provided to cross the bit lines.

In example embodiments, the string selection line and the word lines below the bit line have substantially the same width.

In example embodiments, the number of the channel pipes penetrating the string selection line may be substantially equivalent to the number of the bit lines crossing over the string selection line.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
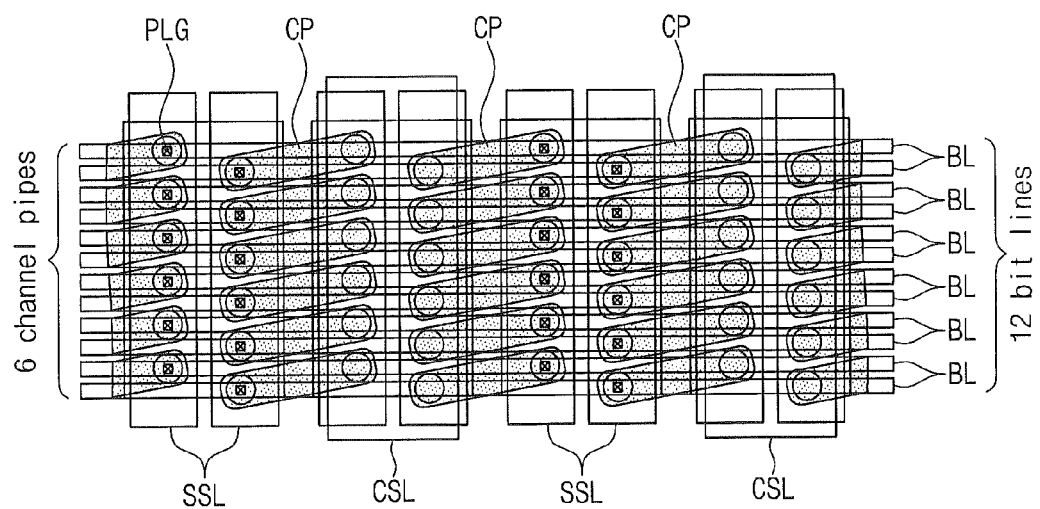
FIG. 1 is a plan view or layout diagram illustrating a portion of a three-dimensional semiconductor memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). Also, "immediately adjacent" elements indicates that there are no intervening ones of those particular elements present, but other intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
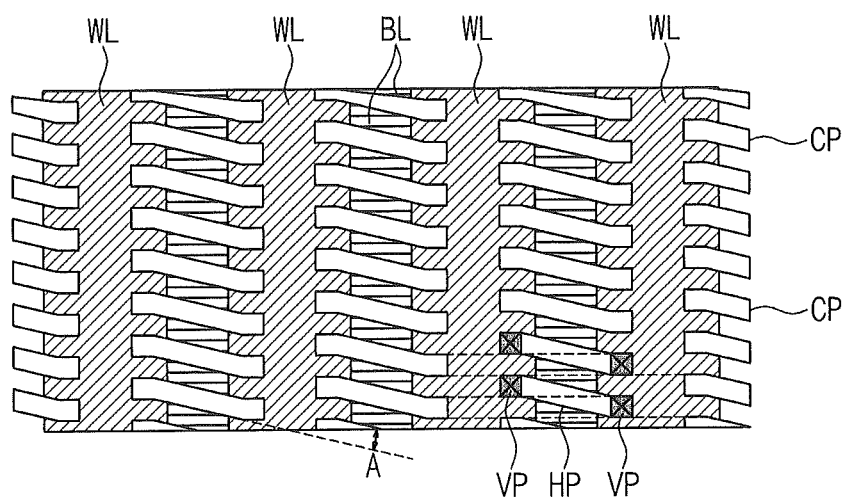
FIG. 2 is a bottom plan view illustrating a portion of a three-dimensional semiconductor memory device according to example embodiments of the inventive concept.
Figure 3:
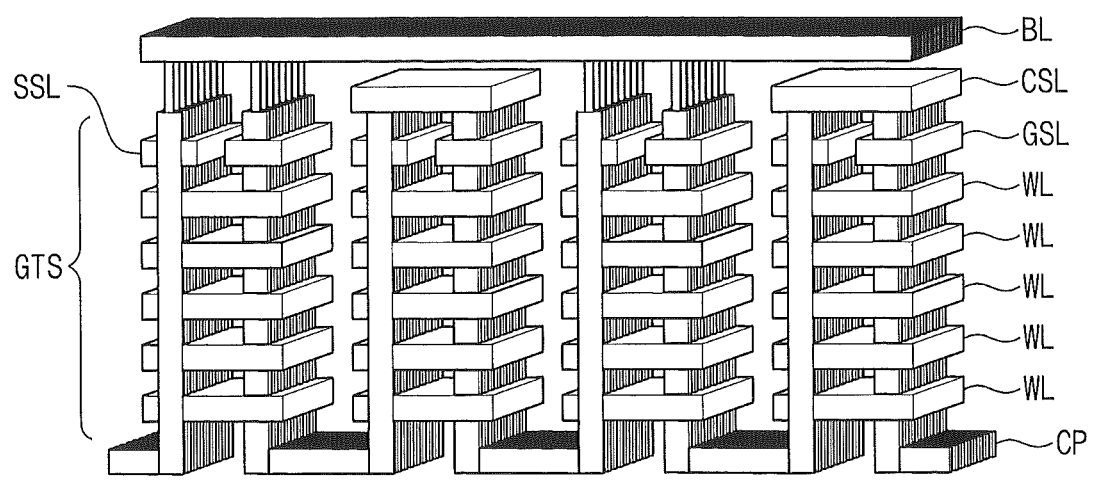
FIGS. 3 through 5 are perspective views illustrating portions of a three-dimensional semiconductor memory device according to example embodiments of the inventive concept.
Figure 4:
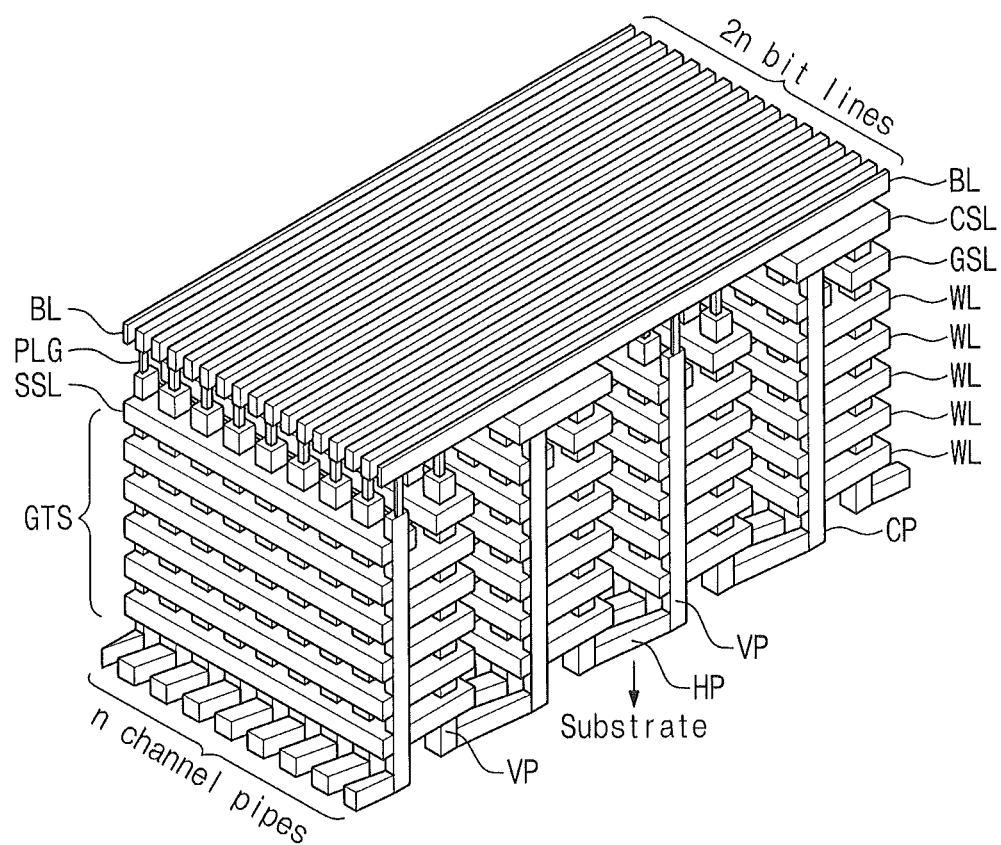
Figure 5:
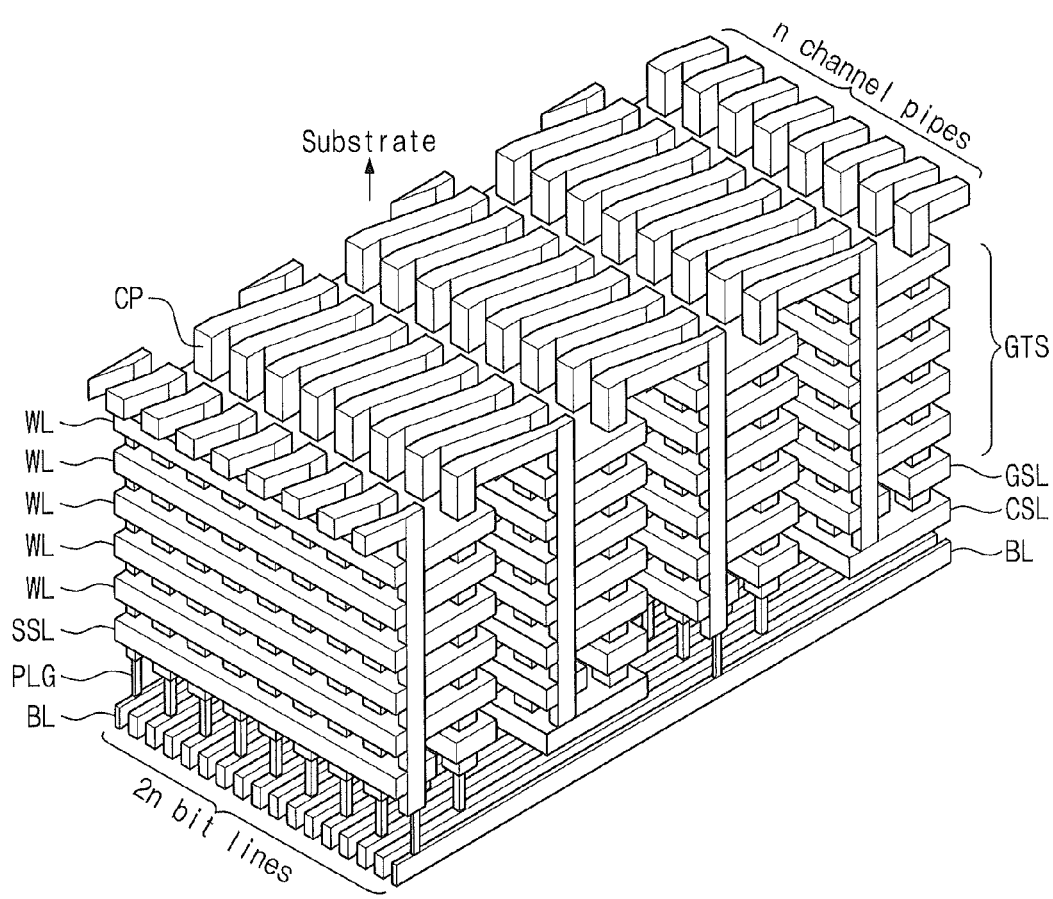

FIG. 1 is a plan view or layout diagram illustrating a portion of a three-dimensional semiconductor memory device according to example embodiments of the inventive concept, FIG. 2 is a bottom plan view illustrating a portion of a three-dimensional semiconductor memory device according to example embodiments of the inventive concept, and FIGS. 3 through 5 are perspective views illustrating a portion of a three-dimensional semiconductor memory device according to example embodiments of the inventive concept.

According to example embodiments of the inventive concept, as shown in FIGS. 1 through 5, a three-dimensional semiconductor memory device may include bit lines BL on a substrate, a gate structure GTS between the substrate and the bit lines BL, a common source line CSL between the gate structure GTS and the bit line BL, and channel pipes CP penetrating and extending through the gate structure GTS. Each of the channel pipes CP may have two end portions connected to the bit line BL and the common source line CSL, respectively, thereby having "U"-shaped vertical section. A plug PLG may be further provided between the gate structure GTS and the bit line BL to connect them to each other.

The gate structure GTS may include a plurality of word lines WL stacked sequentially adjacent sidewalls of the channel pipes CP and selection lines disposed between the word line WL and the bit line BL. The selection line may include string selection lines SSL disposed along the sidewalls of the channel pipes CP between the word line WL and the bit lines BL and a ground selection line GSL disposed along the sidewalls of the channel pipes CP between the common source line CSL and the word line WL. In example embodiments, the string selection lines SSL and ground selection line GSL may be formed using a process of forming the word line WL. At least one of the string selection lines SSL and ground selection line GSL may be formed independently using a different process from that for the word line WL. According to example embodiments of the inventive concept, as shown in FIGS. 1, 4, and 5, a pair of the string selection lines SSL, which are separated from each other in a horizontal direction, may be formed on each of the word lines WL.

Figure 12:
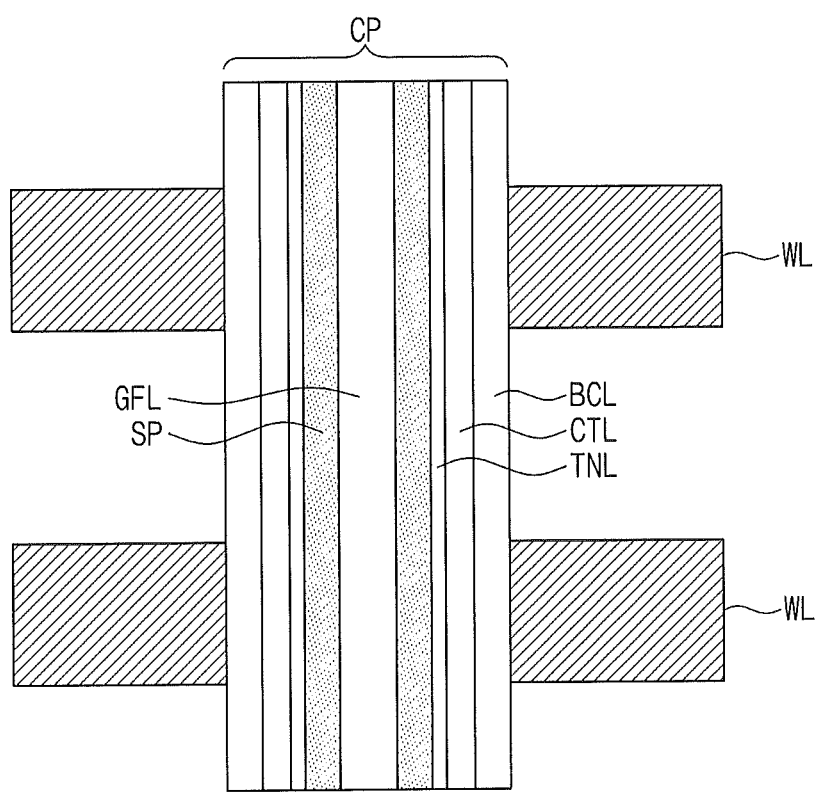
FIGS. 12 through 14 are sectional views illustrating example structures of channel pipe and word line according to example embodiments of the inventive concept.
Figure 13:
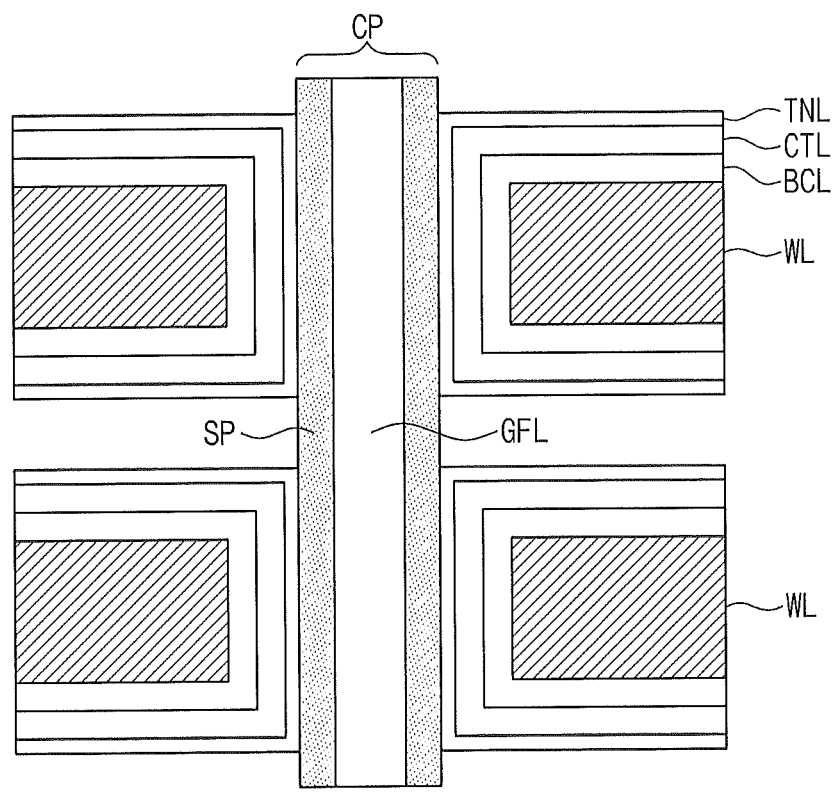
Figure 14:
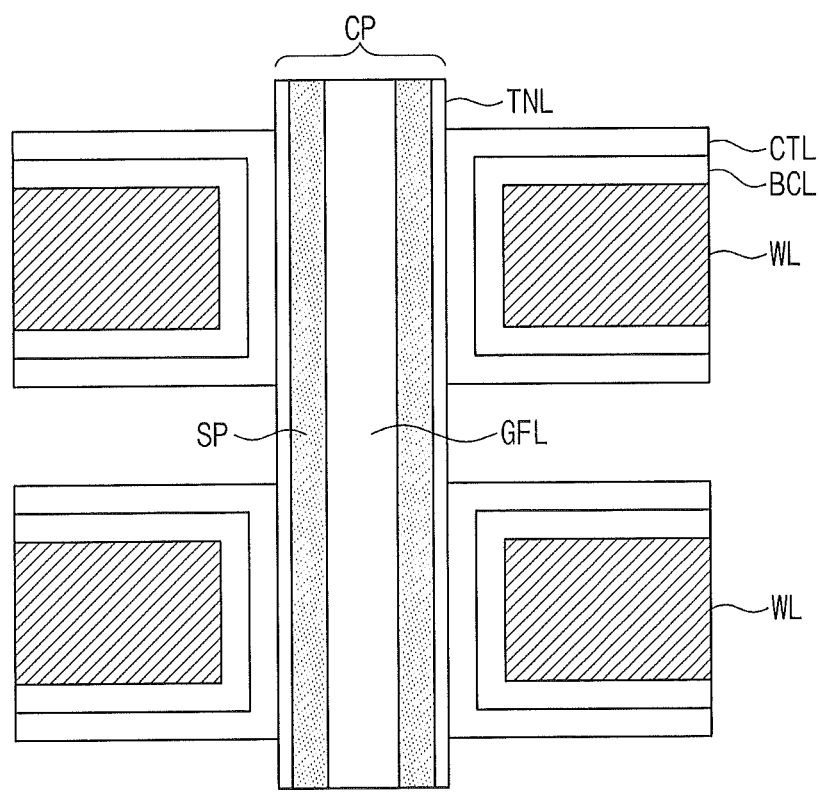

Each of the channel pipes CP may include a semiconductor pattern SP and a memory layer, as shown in FIG. 12. The memory layer may include a tunnel insulating layer TNL, a charge trap layer CTL, and a blocking insulating layer BCL, which cover sequentially an outer wall of the semiconductor pattern SP. Each of the channel pipes CP may further include a gap-fill layer GFL covering an inner wall of the semiconductor pattern SP. The gap-fill layer GFL may be formed of an insulating material and fill an inner space defined by the semiconductor pattern SP. In example embodiments, as shown in FIG. 12, the memory layer may cover continuously the outer wall of the semiconductor pattern SP. In other example embodiments, as shown in FIG. 13, the memory layer may extend horizontally from between sidewalls of the semiconductor pattern SP and the word line WL to cover top and bottom surfaces of the word line WL. In still other example embodiments, as shown in FIG. 14, a portion of the memory layer (e.g., the blocking insulating layer BCL and the charge trap layer CTL) may extend horizontally from between the sidewalls of the semiconductor pattern SP and the word line WL to cover the top and bottom surfaces of the word line WL, and other portion of the memory layer (e.g., the tunnel insulating layer TNL) may cover continuously the outer wall of the semiconductor pattern SP.

The charge trap layer CTL may be insulating layers with many trap sites or insulating layers with nano particles, and be formed using chemical vapor deposition or atomic layer deposition. For example, the charge trap layer CTL may include a trap insulating layer, a floating gate electrode, or an insulating layer with conductive nano dots. In detail, the charge trap layer CTL may include at least one of a silicon nitride layer, a silicon oxynitride layer, a silicon-rich nitride layer, a nanocrystalline silicon layer, and a laminated trap layer.

The tunnel insulating layer TNL may be one or more materials whose band gap is greater than that of the charge trap layer CTL, and may be formed using one of a chemical vapor deposition or an atomic layer deposition. For example, the tunnel insulating layer TNL may be a silicon oxide layer, which may be formed using one of the above-described deposition techniques. Furthermore, a thermal treatment process may be performed to the tunnel insulating layer TNL, after the deposition thereof. The thermal treatment process may be a rapid thermal nitridation (RTN) process or an annealing process, which may be performed in an ambient environment provided with at least one of nitrogen or oxygen.

The blocking insulating layer BCL may include first and second blocking insulating layers, which may be formed of different materials from each other. One of the first and second blocking insulating layers may be one or more materials whose band gap is smaller than that of the tunnel insulating layer TNL and is greater than that of the charge trap layer CTL. Further, the first and second blocking insulating layers may be formed using chemical vapor deposition or atomic layer deposition, and at least one of the first and second blocking layers may be formed using a wet oxidation process. In example embodiments, the first blocking insulating layer may be one or more high-k dielectrics (e.g., aluminum oxide or hafnium oxide), and the second blocking insulating layer may be a material whose dielectric constant is smaller than that of the first blocking insulating layer. In other example embodiments, the second blocking insulating layer may be one or more high-k dielectrics, and the first blocking insulating layer may be a material whose dielectric constant is smaller than that of the second blocking insulating layer.

The word lines WL may be configured to control an electrical potential of the semiconductor pattern SP. For example, an electrical connection between the bit line BL and the common source line CSL may be controlled by the word lines WL, the string selection line SSL, and the ground selection line GSL. According to this configuration, the semiconductor pattern SP may constitute or define a unit cell string of NAND-type cell array structure.

Each of the channel pipes CP or the semiconductor pattern SP may include a pair of vertical or columnar portions VP penetrating and extending through the elements of the gate structure GTS and a horizontal or coupling portion HP connecting the vertical portions to each other below the gate structure GTS, as shown in FIGS. 2 and 4. Accordingly, each of the channel pipes CP or the semiconductor pattern SP may have a "U"-shaped pipe structure between the string selection line SSL and the ground selection line GSL.

According to example embodiments of the inventive concept, in each channel pipe CP or each semiconductor pattern SP, the pair of vertical portions VP may be arranged not to be parallel to the bit lines BL. For example, as shown in FIGS. 1 through 5, the pair of vertical portions VP may be provided below an adjacent pair of the bit lines BL, respectively. Accordingly, as shown in FIG. 2, the horizontal portion HP may be elongated at an angle to the bit line BL. An angle A between the horizontal portion HP and the bit line BL may range from about 3 degree to 45 degree. According to the afore-described configuration, the vertical portions of the semiconductor patterns SP may be formed to have a zigzag arrangement along a longitudinal direction of the string selection lines SSL.

Referring back to FIG. 1, in a longitudinal direction of the string selection line SSL, the number of the bit lines BL may be greater than (e.g., twice that of) the number of channel pipes CP. For example, if the number of the channel pipes CP is six, the number of the bit lines BL may be twelve. Such an increase in the number of the bit lines BL may result from the zigzag arrangement of the vertical portions or the inclined formation of the horizontal portion HP. In program and reading operations, the increase in the number of the bit lines BL makes it possible to increase a page depth.

Figure 6:
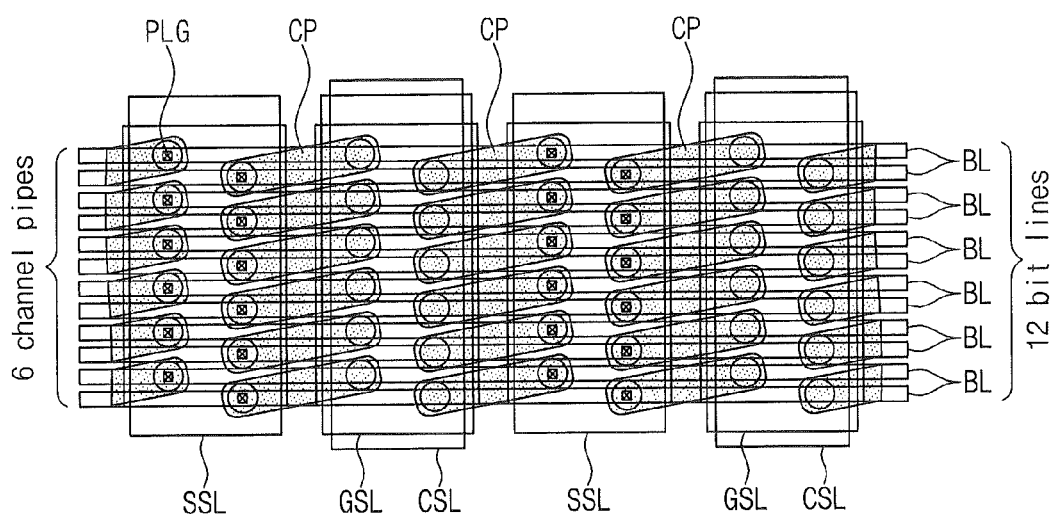
FIG. 6 is a plan view or layout diagram illustrating a portion of a three-dimensional semiconductor memory device according to other example embodiments of the inventive concept.
Figure 7:
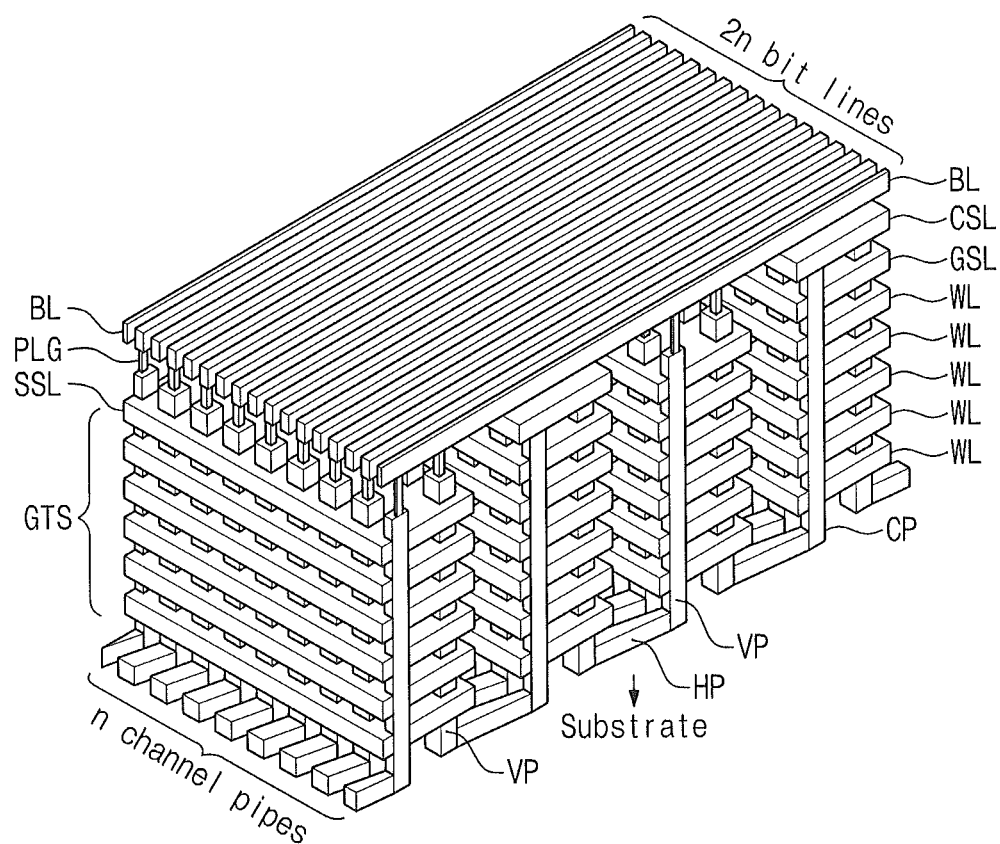
FIG. 7 is a perspective view illustrating a portion of a three-dimensional semiconductor memory device according to other example embodiments of the inventive concept.

FIG. 6 is a plan view or layout diagram illustrating a portion of a three-dimensional semiconductor memory device according to other example embodiments of the inventive concept, and FIG. 7 is a perspective view illustrating a portion of a three-dimensional semiconductor memory device according to other example embodiments of the inventive concept. For conciseness, a previously described element may be identified by a similar or same reference number without repeating the description thereof.

According to the present embodiment, as shown in FIGS. 6 and 7, each of the string selection lines SSL and/or each of the ground selection lines GSL may be formed to have substantially the same shape (e.g., the same horizontal width) as that of the word line WL located thereunder, in plan view. In other words, the portions of the string selection line SSL (or portions of the GSL) may not be horizontally separated from each other on each of the word lines WL. This means that it is possible to omit an additional process for separating the string selection lines SSL (or GSL) from each other in the horizontal direction. In other words, according to the present embodiment, it is possible to simplify a fabrication process, compared with the previous embodiments described with reference to FIGS. 1 through 5.

Figure 8:
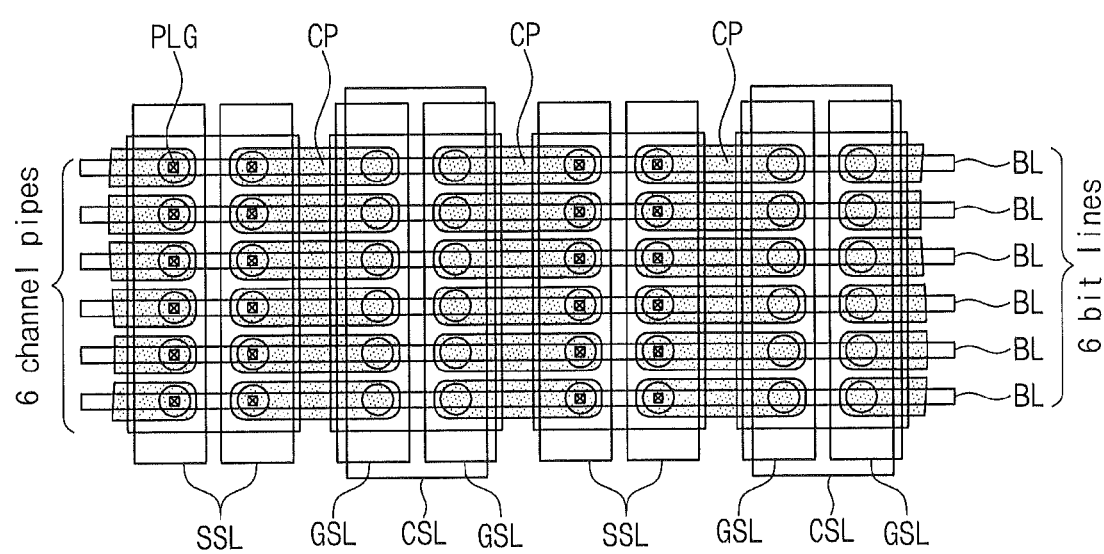
FIG. 8 is a plan view or layout diagram illustrating a portion of a three-dimensional semiconductor memory device according to a comparative example.
Figure 9:
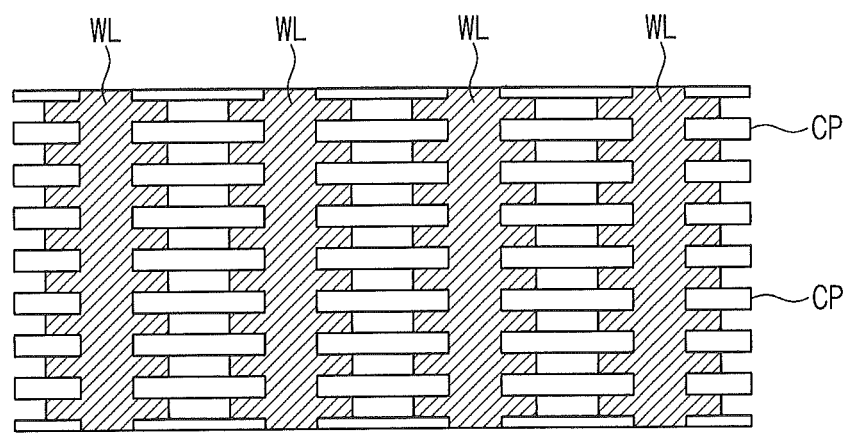
FIG. 9 is a bottom plan view illustrating a portion of a three-dimensional semiconductor memory device according to the comparative example.
Figure 10:
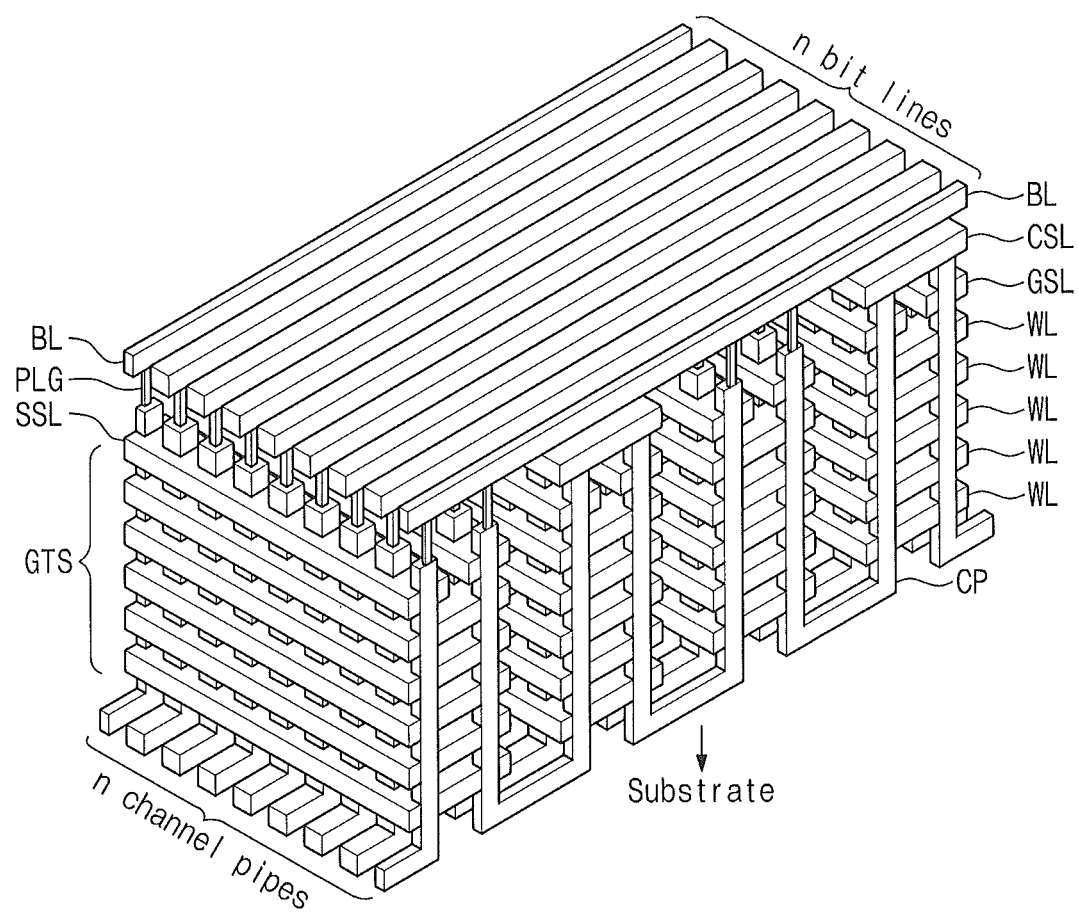
FIGS. 10 and 11 are perspective views illustrating a portion of a three-dimensional semiconductor memory device according to the comparative example.
Figure 11:
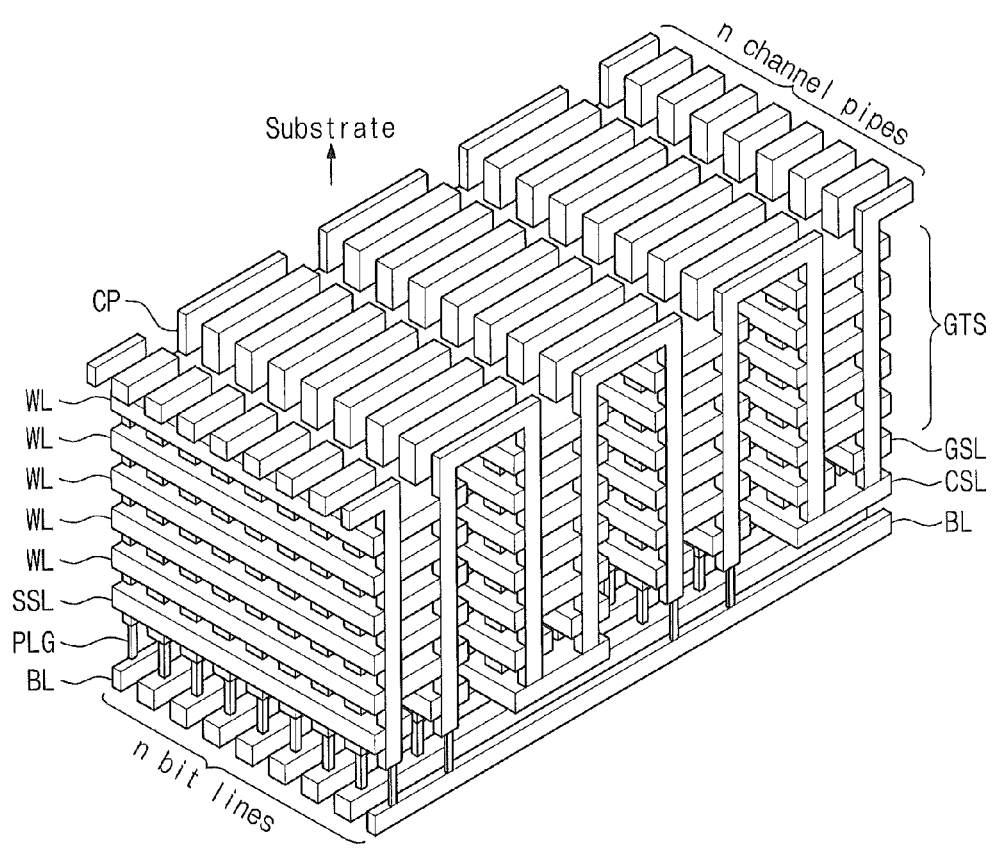

FIG. 8 is a plan view or layout diagram illustrating a portion of a three-dimensional semiconductor memory device according to a comparative example, and FIG. 9 is a bottom plan view illustrating a portion of a three-dimensional semiconductor memory device according to the comparative example, and FIGS. 10 and 11 are perspective views illustrating a portion of a three-dimensional semiconductor memory device according to the comparative example.

In a three-dimensional semiconductor memory device according to a comparative example, the vertical portions VP of each channel pipe CP may be arranged along a corresponding one of the bit lines BL, as shown in FIGS. 8 through 11. Further, each of the bit lines BL may be connected in common to a pair of the channel pipes CP penetrating each of the word lines WL. In other words, a pair of adjacent channel pipes CP are connected to a same bit line BL. Example embodiments of the inventive concept described with reference to FIGS. 1 through 7 may provide several technical advantages that are superior to the comparative example to be described below, due to the limitation of the common connection.

For example, due to the common connection, as shown in FIG. 8, a pair of the channel pipes CP penetrating each of the word lines WL should be independently controlled by a pair of string selection lines that are electrically separated from each other. Such a separation of the string selection lines SSL is needed to operate each of the channel pipes CP independently and is realized by an additional patterning process. The device of FIGS. 6 and 7 may be realized without the additional patterning process, and in this sense, it is superior to the comparative example of FIGS. 8-11.

Further, as the result of the common connection, it can be difficult to increase the number of the bit lines BL over the number of the channel pipes CP, in the longitudinal direction of the string selection line SSL. For example, as shown in FIG. 8, if the number of the channel pipes CP is six, the number of the bit lines BL may also be six. In other words, a page depth of the three-dimensional semiconductor device according to the comparative example may be smaller (e.g., half) than that of the device described with reference to FIGS. 1 through 7. In program and reading operations, a page depth means a size of data that can be processed at a time, and thus, the three-dimensional semiconductor device according to example embodiments of the inventive concept may be configured to have a fast data processing speed, compared with that of the comparative example of FIGS. 8-11.

Figure 15:
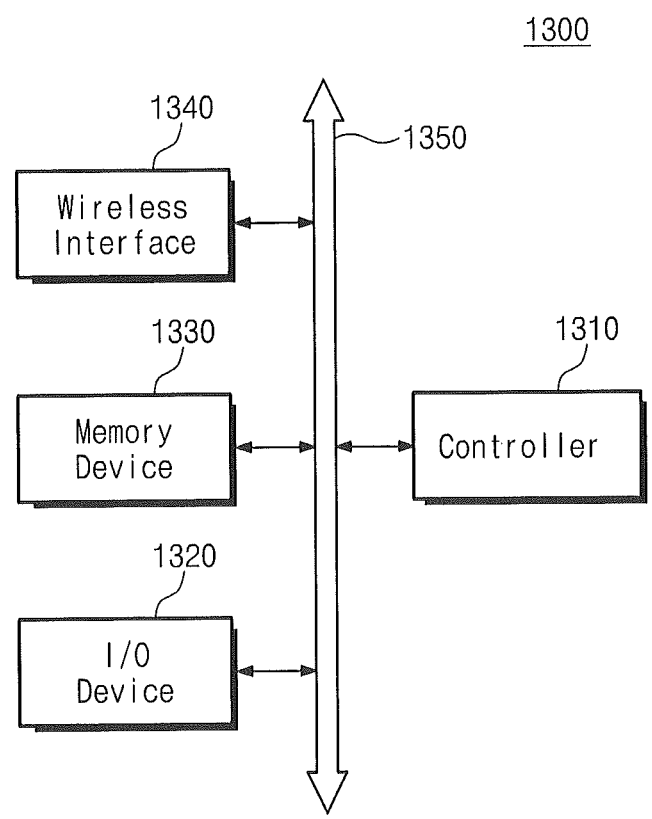
FIGS. 15 and 16 are block diagrams schematically illustrating an electronic device including a semiconductor device according to example embodiments of the inventive concept.
Figure 16:
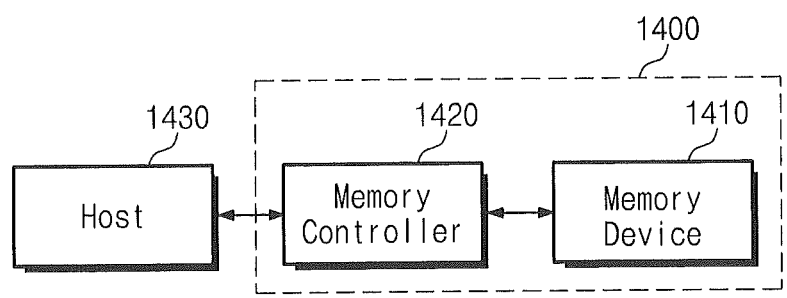

FIGS. 15 and 16 are block diagrams schematically illustrating an electronic device including a semiconductor device according to example embodiments of the inventive concept.

Referring to FIG. 15, an electronic device 1300 including semiconductor devices according to example embodiments of inventive concept may be used a personal digital assistant (PDA), a laptop computer, a mobile computer, a web tablet, a wireless phone, a cell phone, a digital music player, a wire or wireless electronic device, and/or a complex electronic device including at least two of the above devices. The electronic device 1300 may include a controller 1310, an input/output device 1320 such as a keypad, a keyboard, a display, a memory 1330, and a wireless interface 1340 that are connected to each other through a bus 1350. The controller 1310 may include, for example, at least one microprocessor, a digital signal process, a microcontroller or the like. The memory 1330 may be configured to store a command code to be used by the controller 1310 and/or user data. The memory 1330 may include a semiconductor device according to example embodiments of inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 16, a memory system including semiconductor devices according to example embodiments of inventive concept will be described. The memory system 1400 may include a memory device 1410 for storing relatively large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or other computer system) into a physical address of the memory device 1410. The memory device 1410 may be a semiconductor device according to example embodiments of inventive concept.

The semiconductor memory devices disclosed above may be encapsulated using various and diverse packaging techniques. For example, the semiconductor memory devices according to the aforementioned embodiments may be encapsulated using any of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and/or a wafer-level processed stack package (WSP) technique.

The package in which the semiconductor memory devices according to any the above embodiments is mounted may further include at least one semiconductor device (e.g., a controller and/or a logic device) that controls the semiconductor memory device.

According to example embodiments of the inventive concept, three-dimensional semiconductor devices may be configured to have an increased page depth. Accordingly, three-dimensional semiconductor devices according to example embodiments of the inventive concept can provide an increased data-processing speed.

According to example embodiments of the inventive concept, a three-dimensional semiconductor device may be fabricated without an additional patterning process for a separation of string selection lines and/or ground selection lines. This means that the three-dimensional semiconductor device can be fabricated by a simplified process.

While example embodiments of the inventive concept have been particularly shown and described, it will be understood by one of ordinary skill in the art that variations in form and detail may be made therein without departing from the spirit and scope of the attached claims.

What is claimed is:

1. A three-dimensional semiconductor device, comprising: bit lines provided on a substrate; a gate structure provided between the substrate and the bit lines; a common source line provided between the gate structure and the bit lines; and channel pipes connecting the bit lines to the common source line, wherein each of the channel pipes comprises a pair of vertical portions penetrating the gate structure and a horizontal portion connecting the vertical portions, and wherein, in plan view, the pair of vertical portions are provided under a pair of the bit lines arranged adjacent to each other, respectively.

2. The device of claim 1, wherein in each of the channel pipes, one of the pair of vertical portions is connected to one of the bit lines, and the other is connected to the common source line.

3. The device of claim 1, wherein the horizontal portion extends in a longitudinal direction that defines an angle relative to a direction in which the bit lines extend.

4. The device of claim 3, wherein the angle is about 3 degrees to about 45 degrees.

5. The device of claim 1, wherein the gate structure further comprises:
at least one string selection line interposed between the gate structure and the bit lines; and
a ground selection line interposed between the gate structure and the common source line,
wherein the at least one string selection line is provided to the bit lines.

6. The device of claim 5, wherein the gate structure further comprises a plurality of word lines, and wherein the string selection line and the word lines have a same width.

7. The device of claim 5, wherein a number of the channel pipes penetrating the string selection line is equal to a number of the bit lines crossing over the string selection line.

8. A three-dimensional memory device, comprising:
a plurality of bit lines extending in a first direction on a substrate and a common source line extending in a second direction on the substrate; and
a plurality of channel pipes on the substrate connecting the common source line to ones of the bit lines, the channel pipes respectively comprising a pair of columnar portions protruding from the substrate and a coupling portion extending therebetween,
wherein, along the first direction, adjacent ones of the channel pipes are connected to different ones of the bit lines.

9. The device of claim 8, wherein, along the second direction, the bit lines equal or outnumber the channel pipes.

10. The device of claim 9, wherein, along the second direction, adjacent ones of the channel pipes are connected to alternating ones of the bit lines, respectively.

11. The device of claim 10, wherein, along the second direction, respective ones of the pair of columnar portions of each of the adjacent ones of the channel pipes are connected to the alternating ones of the bit lines, respectively.

12. The device of claim 11, wherein, along the second direction, respective other ones of the pair of columnar portions of each of the adjacent ones of the channel pipes are connected to the common source line.

13. The device of claim 12, wherein, along the second direction, the respective other ones of the pair of columnar portions of each of the adjacent ones of the channel pipes overlap with ones of the bit lines between the alternating ones thereof, respectively, in plan view.

14. The device of claim 8, wherein the coupling portion of the respective channel pipes extends in a third direction that defines a non-parallel angle relative to the first direction of the bit lines.

15. The device of claim 14, wherein the coupling portion of each of the channel pipes overlaps with two of the bit lines in plan view.

16. The device of claim 15, wherein the third direction defines a non-perpendicular angle relative to the second direction of the common source line.

17. The device of claim 8, further comprising:
a gate structure between the bit lines and the substrate, the gate structure comprising:
a plurality of word lines adjacent sidewalls of the columnar portions of the channel pipes and extending in the second direction, wherein the columnar portions respectively comprise a semiconductor layer and a memory layer thereon;
a string selection line extending in the second direction between the plurality of word lines and the bit lines; and
a ground selection line extending in the second direction between the plurality of word lines and the common source line.

18. The device of claim 17, wherein the string selection line and/or the ground selection line have a same width as the word lines along the first direction.

19. The device of claim 17, wherein the string selection line and/or the ground selection line have a narrower width than the word lines along the first direction.

* * * * *